United States Patent
Sano et al.

(10) Patent No.: US 6,596,986 B1
(45) Date of Patent: Jul. 22, 2003

(54) REFLECTIVE SENSOR

(75) Inventors: Masashi Sano, Kyoto (JP); Nobuaki Suzuki, Kyoto (JP); Shinichi Suzuki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/700,634
(22) PCT Filed: Apr. 30, 1999
(86) PCT No.: PCT/JP99/02358
§ 371 (c)(1),
(2), (4) Date: Nov. 16, 2000
(87) PCT Pub. No.: WO99/60632
PCT Pub. Date: Nov. 25, 1999

(30) Foreign Application Priority Data

May 20, 1998 (JP) .......................................... 10-138689
May 20, 1998 (JP) .......................................... 10-138690

(51) Int. Cl.$^7$ .................................................. H01I 5/02
(52) U.S. Cl. ................................... 250/239; 250/551
(58) Field of Search .............................. 250/551, 239

(56) References Cited

U.S. PATENT DOCUMENTS 5,753,929 A * 5/1998 Bliss ........................... 250/551

FOREIGN PATENT DOCUMENTS

| JP | 58-93387 | 6/1983 | ........... H01L/31/12 |
| JP | 58-93388 | 6/1983 | ........... H01L/31/12 |
| JP | 58093387 A | * 6/1983 | |
| JP | 358093387 A | * 6/1983 | |
| JP | 59-168682 | 9/1984 | ........... H01L/31/12 |
| JP | 60-35244 | 2/1985 | ........... G01N/21/47 |
| JP | 60-43877 | 3/1985 | ........... H01L/31/12 |
| JP | 60-170982 | 9/1985 | ........... H01L/31/10 |
| JP | 60-189976 | 9/1985 | ........... H01L/31/12 |
| JP | 6-85313 | 3/1994 | ........... H01L/31/12 |
| JP | 406085313 A | * 3/1994 | |

OTHER PUBLICATIONS

English Language Abstracts for JP 58–933387, 58–933388, 59–168682, 60–35244 and 60–43877.

English Language Abstracts of JP 60–170982, 60–189976 and 6–85313 Copy of Supplementary European Search Report.

* cited by examiner

Primary Examiner—Robert H. Kim
Assistant Examiner—Hoon K. Song
(74) Attorney, Agent, or Firm—Michael D. Bednarek; Shaw Pittman LLP

(57) ABSTRACT

A reflection sensor (1) for detecting presence of a detection object is provided. The reflection sensor comprises a light emitting element (31), a light receiving element (32) cooperative with the light emitting element, a first resin body (21) enclosing the light emitting element and including a first surface and a second surface away from the first surface, a second resin body (22) enclosing the light receiving element and including a third surface and a fourth surface away from the third surface, and a third resin body (25) holding the first and the second resin bodies. The reflection sensor further comprises a first pair of leads (5a, 5b) electrically connected to the light emitting element via a wire (4a) for example, and a second pair of leads (5c, 5d) electrically connected to the light receiving element via another wire (4b) for example. The leads of the first pair and the second pair extend out of one side surface (2a) or another side surface (2b) of the third resin body. The leads of the first pair and the second pair have respective free end portions (51a, 51b, 51c, 51d) connected to connecting pads P on a substrate S via solder H. The first resin body and the second resin body have respective upper surfaces and bottom surfaces exposed to outside.

11 Claims, 10 Drawing Sheets

REFLECTIVE SENSOR

TECHNICAL FIELD

The present invention relates to a reflection sensor used for detecting presence of a detection object. More specifically, the present invention relates to a reflection sensor surface-mounted on a substrate.

BACKGROUND ART

As a sensor for detecting presence of a detection object, a contact sensor incorporating a micro-switch and a non-contact sensor such as a photo-interrupter are used conventionally. Generally, the photo-interrupter includes so-called transmission photo-interrupters and reflection photo-interrupters. The transmission photo-interrupter comprises a light emitting element and a light receiving element faced to each other. On the other hand, the reflection photo-interrupter comprises the light emitting element and the light receiving element faced in a same direction.

Recently, demand for the reflection photo-interrupter is greater than for the transmission photo-interrupter. A reason for this is that the reflection photo-interrupter has a construction which allows mounting on a greater variety of locations than does the transmission photo-interrupter.

Now, a conventional reflection sensor (photo-interrupter) will be described with reference to FIG. 9 to FIG. 21. A reflection sensor 1 shown in the figures has a generally rectangular parallelepiped protective package 2 (FIG. 19), in which a light emitting element 31 and a light receiving element 32 are buried (FIGS. 20 and 21).

The protective package 2 includes a first resin body 21 enclosing the light emitting element 31, a second resin body 22 enclosing the light receiving element 32, and a third resin body 25 for holding these two resin bodies 21, 22. As shown in FIG. 19, the first and the second resin bodies 21, 22 have respective upper surfaces exposed to outside, but the other surfaces are covered by the third resin body 25.

The first and the second resin bodies 21, 22 are transparent, allowing light to pass through. The first and the second resin bodies 21, 22 are formed of an epoxy resin for example. On the other hand, the third resin body 25 is non-transparent and therefore does not allow the light to pass through. The third resin body 25 is formed of a black PPS (polyphenylene sulfide) for example.

The epoxy resin has a linear expansion coefficient of $11\sim12\times10^{-5}/°$ C. for example, whereas the PPS has a linear expansion coefficient of $6\sim7\times10^{-5}/°$ C. for example. Therefore, when heated, the first and the second resin bodies 21, 22 made of the epoxy resin expand at a greater rate than does the third resin body 25 which is made of the PPS.

As shown in FIG. 20, the light emitting element 31 is electrically bonded to a lead 5a, and electrically connected to another lead 5b via a wire 4a. Likewise, the light receiving element 32 is electrically bonded to a lead 5c, and electrically connected to another lead 5d via a wire 4b. The leads 5a~5d have free end portions soldered to electrode pads P provided on a substrate S respectively. The soldering can be achieved by using a solder re-flow method to be described here below.

First, solder paste H is applied to each of the electrode pads P. Next, the reflection sensor 1 is placed on the substrate S so that the free end portions of the leads 5a~5d are located on the corresponding electrode pads P. The substrate S and the reflection sensor 1 in this state is brought in a heating furnace and heated. The temperature in the heating furnace at this time is not lower than 200° C. for example. Thus, the applied solder paste melts thereby wetting the free end portions of the leads 5a~5d and the electrode pads P. Then, the substrate S and the reflection sensor 1 is taken out of the heating furnace and allowed to cool, so that the solder paste sets to fix the reflection sensor 1 onto the substrate S.

The conventional reflection sensor 1 with the above described construction is known to have the following problems.

Specifically, as has been described earlier, the first and the second resin bodies 21, 22 thermally expand at a greater rate than does the third resin body 25. However, the first and the second resin bodies 21, 22 are surrounded by the third resin body 25 except for the respective upper surfaces. Therefore, when the reflection sensor 1 is heated, the first and the second resin bodies 21, 22 expand only in an upward direction as indicated by a dashed line in FIG. 20. When the resin bodies 21, 22 expand only in one direction as in the above, the wire 4a, 4b can be pulled off the lead 5b, 5d respectively.

Further, the conventional reflection sensor 1 has the following problem. Specifically, as has been described earlier, the reflection sensor 1 is heated to the temperature not lower than 200° C. in the heating furnace, and then cooled. During the cooling, the molten solder paste H becomes solid at a temperature of about 180° C. for example, fixing the leads 5a~5d onto the electrically conductive pads P. However, at this particular point (at the temperature of 180° C.), the protective package 2 (especially the first and the second resin bodies 21, 22) is still in a thermally expanded state in a course of thermal shrinkage with ongoing decrease in temperature.

If the protective package shrinks while the leads 5a~5d have been fixed onto the conductive pads P, a force to pull the leads 5a~5d off the protective package 2 is exerted. This generate excessive stress on the wires 4a, 4b, and can pull the wires 4a, 4b off the leads 5a~5d.

DISCLOSURE OF THE INVENTION

It is therefore an object of the present invention to provide a reflection sensor capable of solving the above described problem.

A reflection sensor provided by a first aspect of the present invention comprises:
- a light emitting element;
- a light receiving element cooperative with the light emitting element;
- a first resin body enclosing the light emitting element and including a first surface and a second surface away from the first surface;
- a second resin body enclosing the light receiving element and including a third surface and a fourth surface away from the third surface;
- a third resin body holding the first and the second resin bodies;
- a first pair of leads electrically connected to the light emitting element;
- a second pair of leads electrically connected to the light receiving element;
- wherein the first surface and the second surface of the first resin body and the third surface and the fourth surface of the second resin body are respectively exposed to outside.

According to the arrangement as described above, each of the first resin body and the second resin body can thermally expand uniformly in upward and downward directions. Therefore, it becomes possible to effectively prevent unwanted stress from developing within the first resin body and the second resin body.

According to a preferred embodiment of the present invention, the first and the second resin bodies are transparent whereas the third resin body is non-transparent. Here, the term "transparent" is used for a case in which the resin body allows a predetermined light to pass through. Therefore, if a resin body which looks black to human eyes allows an infrared ray for example, the resin body is described as "transparent" to the infrared ray.

According to the above preferred embodiment, the first and the second resin bodies have a thermal expansion coefficient larger than that of the third resin body.

Preferably, the first and the second resin bodies are formed of an epoxy resin whereas the third resin body is formed of a heat resistant resin.

Preferably, the second surface of the first resin body provides a bottom surface of the first resin body whereas the fourth surface of the second resin body provides a bottom surface of the second resin body.

Preferably, the bottom surface of the first resin body and the bottom surface of the second resin body are covered only partially by the third resin body.

The leads of the first pair and the second pair have respective free end portions flush with the bottom surface of the second resin body. According to the arrangement as above, the reflection sensor can be easily fixed on a substrate by means of a solder re-flow method for example.

A reflection sensor provided by a second aspect of the present invention comprises:

a light emitting element;

a light receiving element cooperative with the light emitting element;

a first resin body enclosing the light emitting element and including an upper surface and a bottom surface away from the upper surface;

a second resin body enclosing the light receiving element and including an upper surface and a bottom surface away from the upper surface;

a third resin body holding the first and the second resin bodies;

a first pair of leads electrically connected to the light emitting element;

a second pair of leads electrically connected to the light receiving element;

wherein the leads of the first pair and the second pair are respectively provided with engaging means for engagement with the third resin body whereby preventing the leads from displacement with respect to the third resin body.

According to the arrangement as the above, even if the leads of the first pair and the second pair come under an unwanted tension, the leads are not displaced with respect to the third resin body.

According to a preferred embodiment of the present invention, the leads of the first pair are formed with projecting portions extending from the first resin body into the third resin body. Further, the leads of the second pair are formed with projecting portions extending from the second resin body into the third resin body into the third resin body.

According to another embodiment of the present invention, the leads of the first pair and the second pair are respectively formed with projecting portions at locations where the leads cross the third resin body.

According to still another embodiment of the present invention, the leads of the first pair and the second pair are respectively formed with cutouts at locations where the leads cross the third resin body.

According to still another embodiment of the present invention, the leads of the first pair and the second pair are respectively formed with bent portions at locations where the leads cross the third resin body.

According to still another embodiment of the present invention, the upper surface and the bottom surface of the first resin body, and the upper surface and the bottom surface of the second resin body are exposed outside.

Other objects, characteristics, and advantages of the present invention will become clearer from the following description of embodiments to be presented with reference to the accompanying drawings.

BEST MODE FOR CARRYING OUT THE INVENTION

Now, preferred embodiments of the present invention will be described specifically, with reference to FIG. 1 to FIG. 18.

Figure 1:
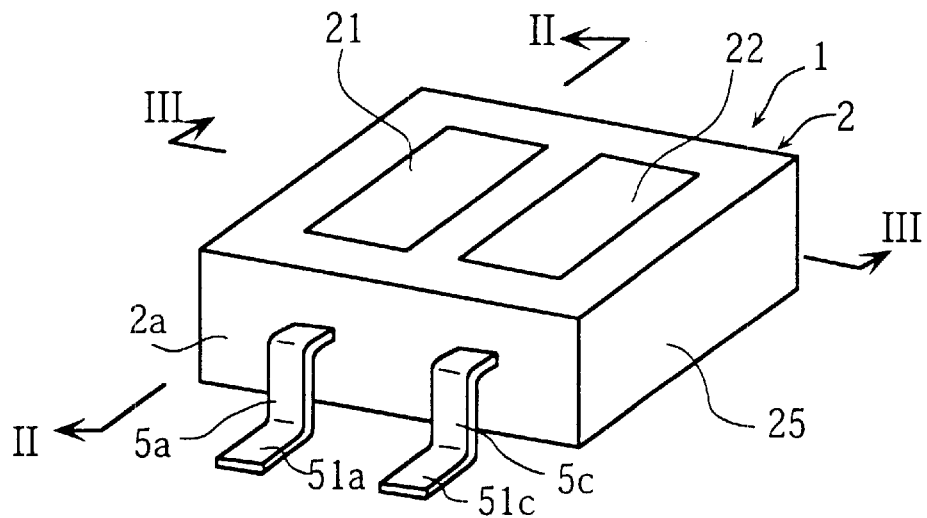
FIG. 1 is a perspective view of a reflection sensor according to a first embodiment of the present invention.
Figure 2:
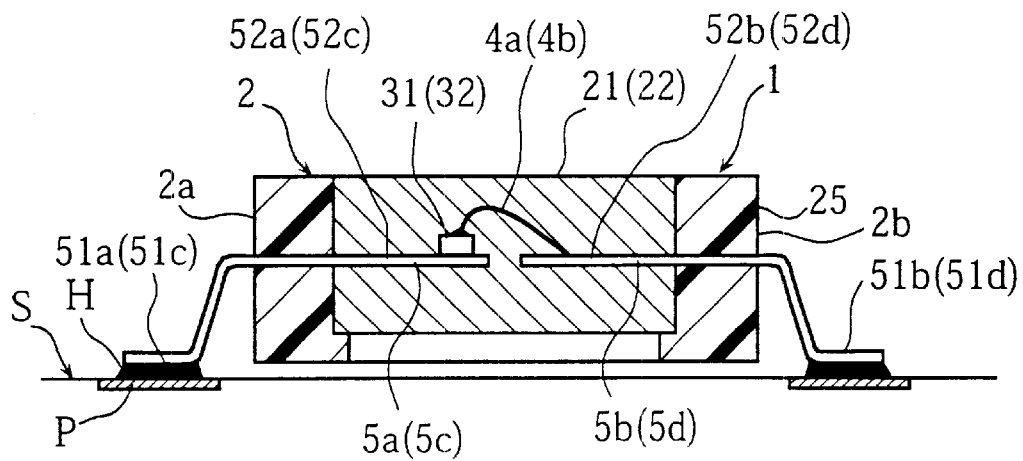
FIG. 2 is a sectional view taken in lines II—II in FIG. 1.
Figure 3:
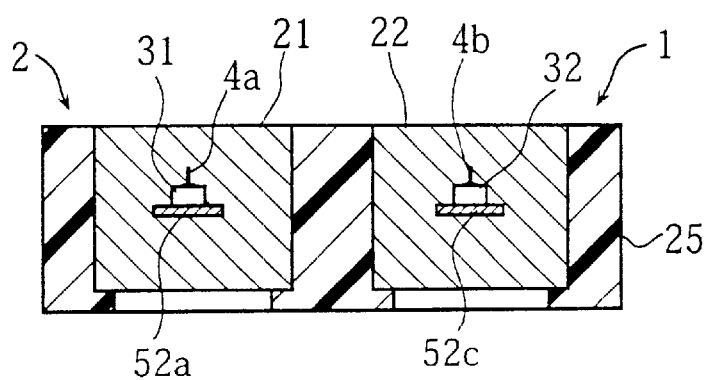
FIG. 3 is a sectional view taken in lines III—III in FIG. 1.

First, reference is made to FIGS. 1 to 3. These figures show a reflection sensor 1 according to a first embodiment of the present invention. FIG. 1 is a perspective view of the reflection sensor 1, FIG. 2 is a sectional view taken in lines II—II in FIG. 1, and FIG. 3 is a sectional view taken in lines III—III in FIG. 1.

As shown in FIG. 3, the reflection sensor 1 comprises a light emitting element 31 and a light receiving element 32. These elements are sealed in a protective package 2 made of a resin. As understood from FIG. 1, the protective package 2 is generally rectangular parallelepiped. The light emitting element 31 is a light emitting diode for example whereas light receiving element 32 is a phototransistor or a photodiode for example.

As shown in FIG. 2, the light emitting element 31 is electrically connected to a pair of metal leads 5a, 5b. Likewise, the light receiving element 32 is electrically connected to a pair of metal leads 5c, 5d. The leads 5a, 5c extend out of a first side surface 2a of the protective package 2 whereas the leads 5b, 5d extend out of a second side surface 2b away from the first side surface 2a. (Hereinafter, extending portions of respective leads 5a~5d are called the outer portions.) As shown in FIGS. 1 and 2, the outer portions of the leads 5a~5d are bent in a shape of L to form horizontally extending free end portions 51a~51d respectively.

The protective package 2 includes a first resin body 21 enclosing the light emitting element 31, a second resin body 22 enclosing the light receiving element 32, and a third resin body 25 holding the first and the second resin bodies. The first resin body 21 is spaced from the second resin body 22 by a predetermined distance. The third resin body 25 has a bottom surface generally flush with the free end portions 51a~51d of the leads 5a~5d. With such an arrangement as above, the reflection sensor 1 can be placed stably onto a flat substrate.

The first and the second resin bodies 21, 22 have respective upper surfaces not covered by the third resin body 25. Further, the first and the second resin bodies 21, 22 have respective lower surfaces covered only partially by the third resin body 25. Specifically, only peripheral portions of respective lower surfaces of the first and the second resin bodies 21, 22 are covered by the third resin body 25, with the rest being exposed outside.

The first resin body 21 and the second resin body 22 are transparent, allowing a light to pass through. On the other hand, the third resin body 25 is non-transparent, and does not allow the light to pass through. According to an arrangement as above, it becomes possible to prevent the light from entering through surfaces of the second resin body 22. Therefore, it also becomes possible to prevent the light receiving element 32 from directly detecting the light emitted from the light emitting element 31. The first and the second resin bodies 21, 22 are formed of a transparent epoxy resin for example. The third resin body 25 is formed of a black PPS (polyphenylene sulfide) for example. The PPS has good heat resistance and mechanical strength.

As shown in FIG. 2 and FIG. 3, the light emitting element 31 is bonded to an inner portion 52a of the lead 5a. The light emitting element 31 has an upper surface electrically connected to an inner portion 52b of the lead 5b via a wire 4a. The wire 4a is connected to the upper surface of the light emitting element 31 by means of ball bonding, and to the inner portion 52b of the lead 51b by means of stitch bonding. Likewise, the light receiving element 32 is bonded to an inner portion 52c of the lead 5c. The light receiving element 32 has an upper surface electrically connected to an inner portion 52d of the lead 5d via a wire 4b.

Figure 4:
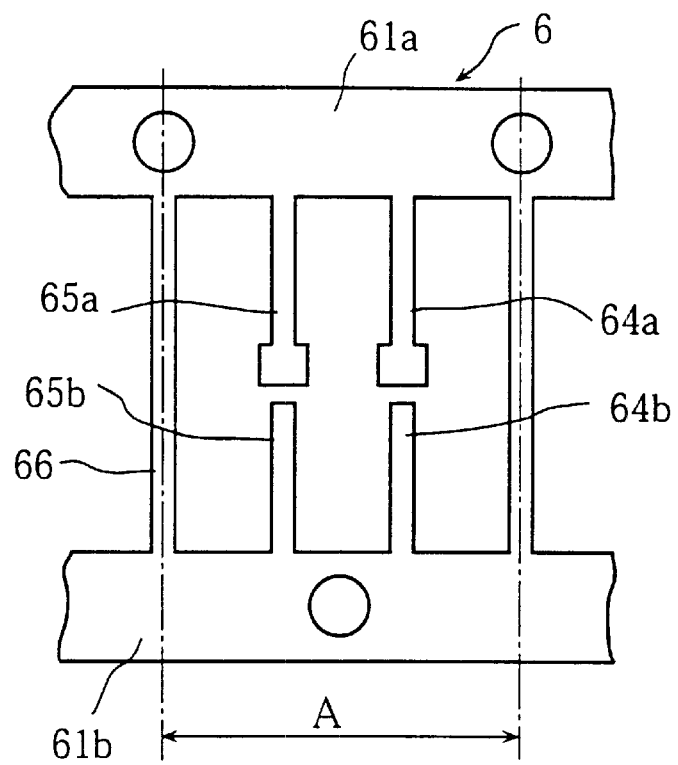
FIG. 4 is a plan view showing a lead frame used for manufacture of the reflection sensor in FIG. 1.
Figure 5:
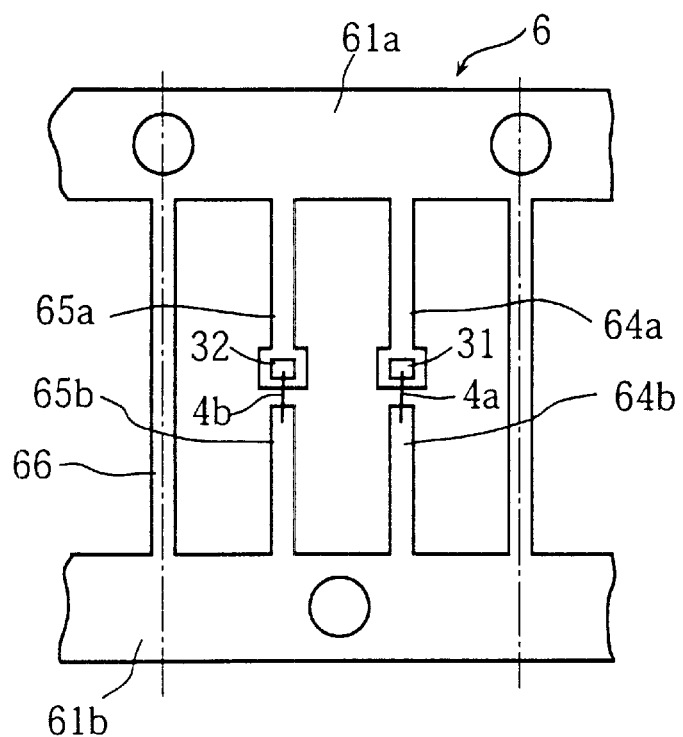
FIG. 5 shows a state in which a light emitting element and light receiving element are mounted on the lead frame in FIG. 4.

The reflection sensor 1 having the arrangement described as above can be manufactured in the following steps to be described below. First, a lead frame 6 as shown in FIG. 4 is prepared. The lead frame 6 can be produced by pressing a thin metal plate. As shown in the figure, the lead frame 6 includes a first long side band 61a and a second long side band 61b extending in parallel to each other. The first and the second side bands 61a, 61b are connected with each other via a plurality of cross members 66. The cross members 66 are spaced from each other by a predetermined distance A longitudinally of the lead frame 6.

In a region between a pair of mutually adjacent cross members 66, the first side band 61a is formed with two first leads 64a, 65a each extending toward the second side band 61b. On the other hand, the second side band 61b is formed with two second leads 64b, 65b each extending toward the first side band 61b. The first leads 64a, 65a have respective free end portions spaced from corresponding free end portions of the second leads 64b, 65b by a predetermined distance. As shown in FIG. 4, the free end portions of the first leads 64a, 65a are made wider than the other portions. (Hereinafter, these wider free end portions are referred to as the head portions.)

After preparing the lead frame 6 as described above, as shown in FIG. 5, the light emitting element 31 is bonded to the head portion of the first lead 64a, and the light receiving element 32 is bonded to the other head portion of the first lead 65a. Thereafter, the upper surface of the light emitting element 31 and the second lead 64b are electrically connected together via the wire 4a.

Figure 6:
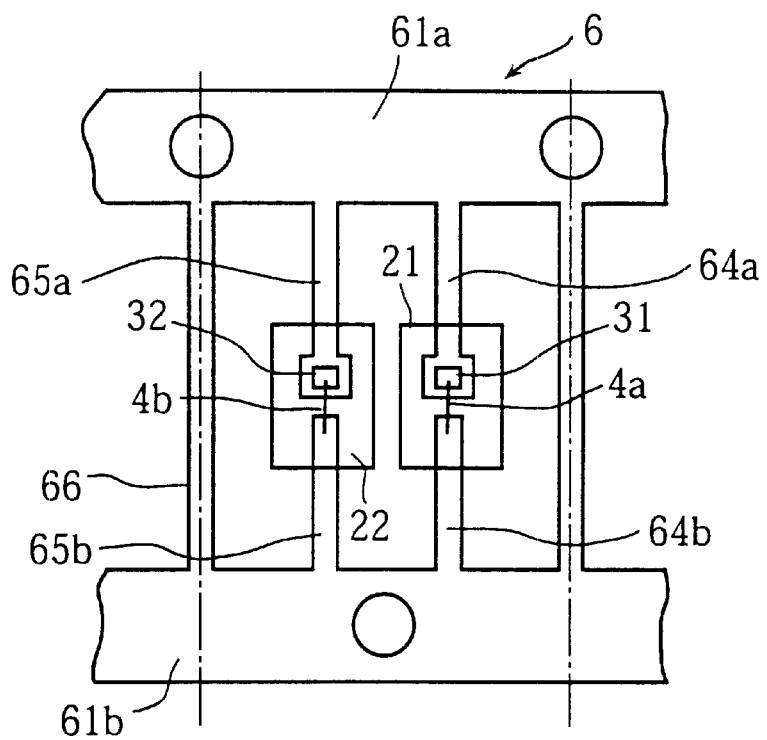
FIG. 6 shows a state in which each of the light emitting element and the light receiving element is covered by a transparent resin body.

Next, as shown in FIG. 6, the light emitting element 31 and the wire 4a are enclosed in the transparent resin body 21 (hereinafter referred to as the first resin body), and the light receiving element 32 and the wire 4b are enclosed in another transparent resin body 22 (hereinafter referred to as the second resin body) Formation of the first and the second resin bodies 21, 22 can be achieved by means of a transfer molding method for example (the first molding step).

Figure 7:
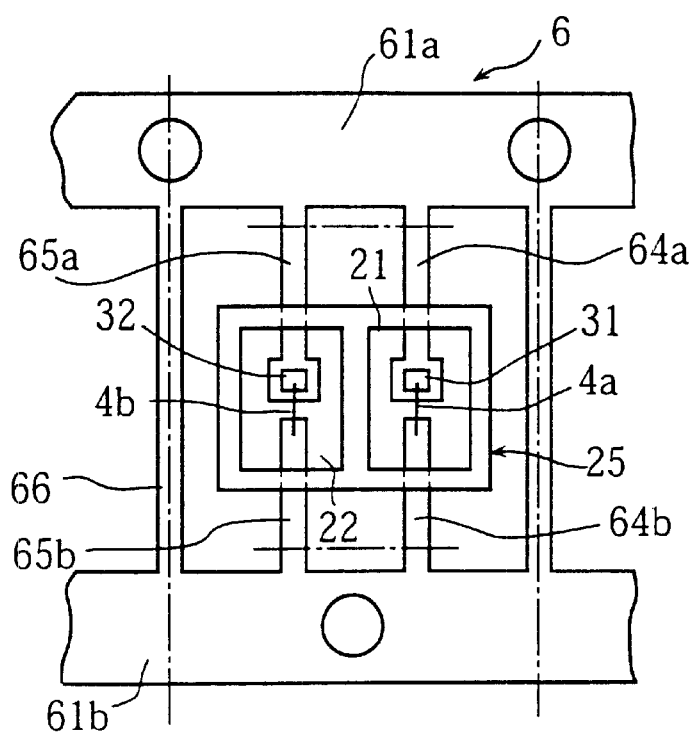
FIG. 7 shows a state in which the resin bodies in FIG. 6 is enclosed by another resin body which is non-transparent.

Next, as shown in FIG. 7, in order to hold both of the first and the second resin bodies 21, 22, the third resin body 25 made of the black PPS is formed. Formation of this resin body can also be achieved by means of the transfer molding method (the second molding step). The third resin body 25 is formed so that the upper surfaces and the bottom surfaces of the first and the second resin bodies 21, 22 are exposed to outside.

Next, the first leads 64a, 65a are cut off the first side band 61a, and the second leads 64b, 65b are cut off the second side band 61b (lead cutting step).

Finally, each of the leads is bent into a shape of L (lead forming step), providing an individual reflection sensor 1 as shown in FIG. 1.

Hereinafter, function of the reflection sensor 1 will be described.

As has been mentioned earlier, the reflection sensor 1 can be placed stably onto a flat surface. Therefore, the reflection sensor 1 can be easily mounted onto a substrate by using the following method.

Figure 8:
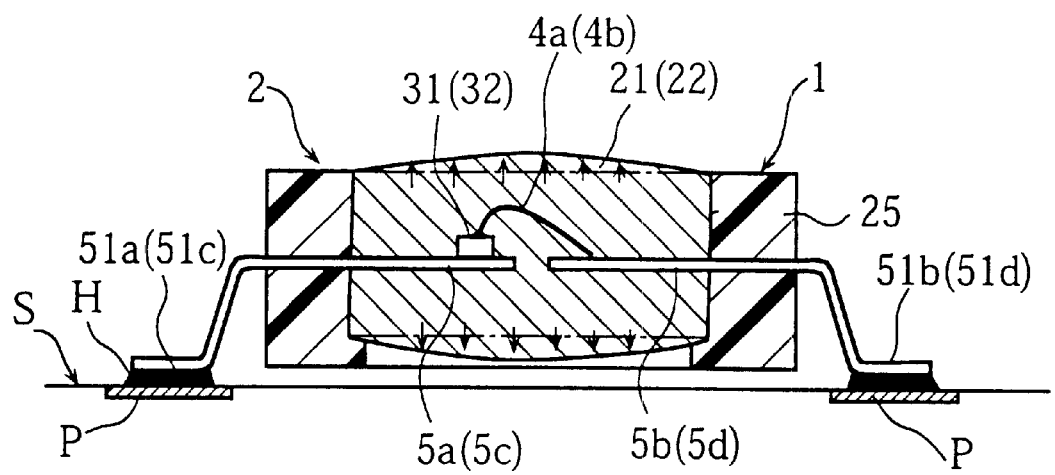
FIG. 8 is a diagram illustrating advantages of the reflection sensor in FIG. 1.

First, a substrate S onto which the reflection sensor 1 is to be mounted is prepared (FIG. 8). The substrate S provides four electrically conductive pads P per one reflection sensor 1. (Only two of the pads are shown in the figure.) Solder paste H is applied in advance to each of the conductive pads P by means of printing for example.

Next, the reflection sensor 1 is placed onto the substrate S so that the free end portions 51a~51d of the leads 5a~5d are positioned on the conductive pads P respectively. Then, in this state, the substrate S and the reflection sensor 1 are brought into a heating furnace for heating at a temperature of about 250° C. In this step, the solder paste H is melted thereby wetting each of the conductive pads P and the free end portions 51a~51d.

Thereafter, the reflection sensor 1 and the substrate S are taken out of the heating furnace, and cooled to allow the molten solder paste H to set. In this step, the free end portions 51a~51d of the leads are bonded electrically and mechanically to the corresponding conductive pads P.

Figure 20:
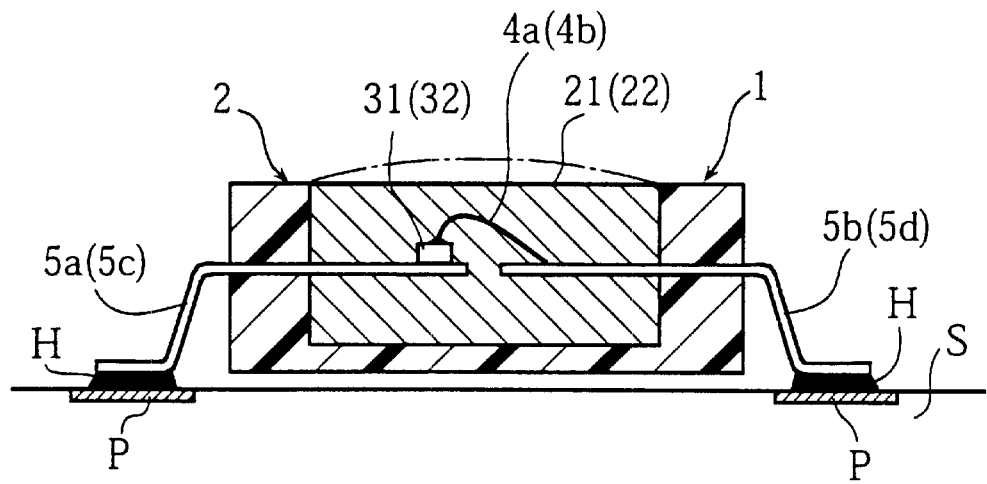
FIG. 20 is a sectional view taken in lines XX—XX in FIG. 19.
Figure 21:
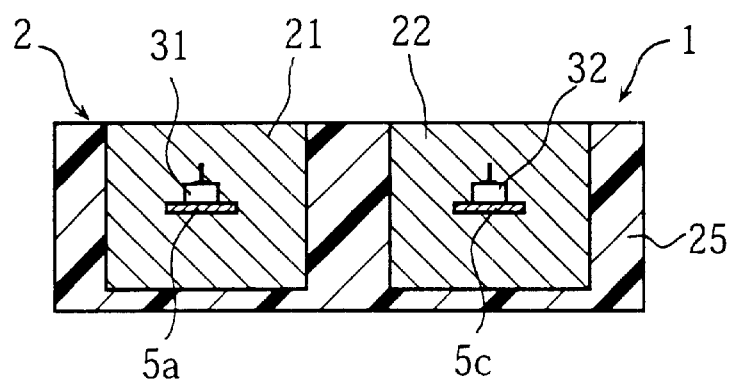
FIG. 21 is a sectional view taken in lines XXI—XXI in FIG. 19.

The reflection sensor 1 has the following advantages. As has been described earlier, according to the reflection sensor 1, the upper surfaces and the bottom surfaces of the first and the second resin bodies 21, 22 are not covered by the third resin body 25. Therefore, as emphatically illustrated in FIG. 8 for clarity, when the first and the second resin bodies 21, 22 thermally expand, these resin bodies can expand uniformly in opposite directions (i.e. upward and downward). Thus, as compared to the conventional reflection sensor shown in FIG. 20, it becomes possible to effectively reduce stress generated within the protective package 2. This reduces unwanted displacement of the light emitting element 31, the light receiving element 32 or the wires 4a, 4b, making possible to eliminate failure of the wires 4a, 4b.

Figure 9:
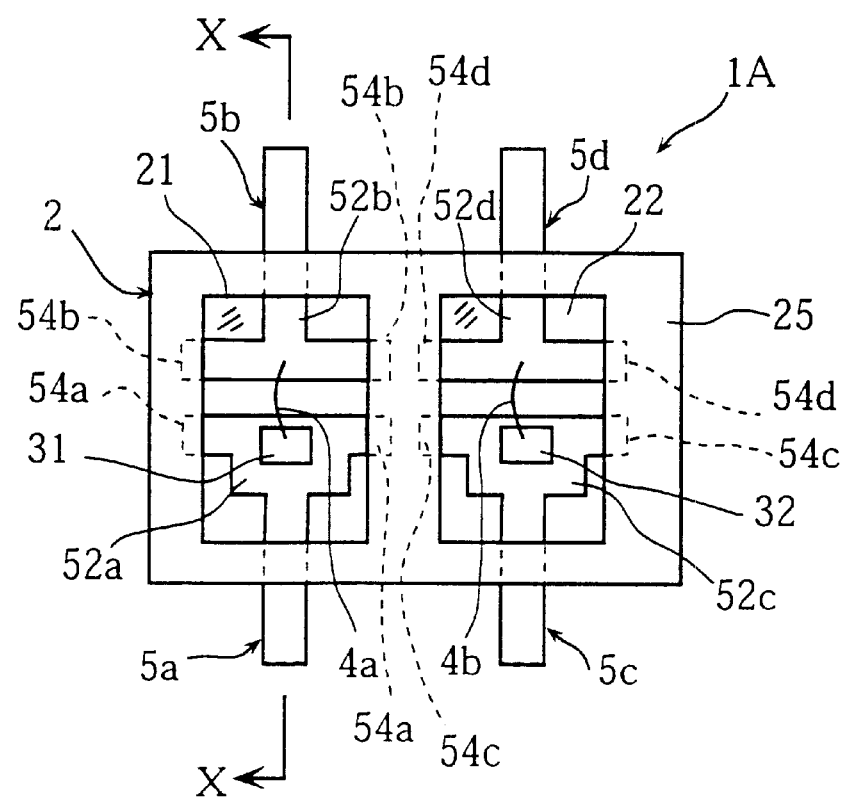
FIG. 9 is a plan view showing a reflection sensor according to a second embodiment of the present invention.
Figure 10:
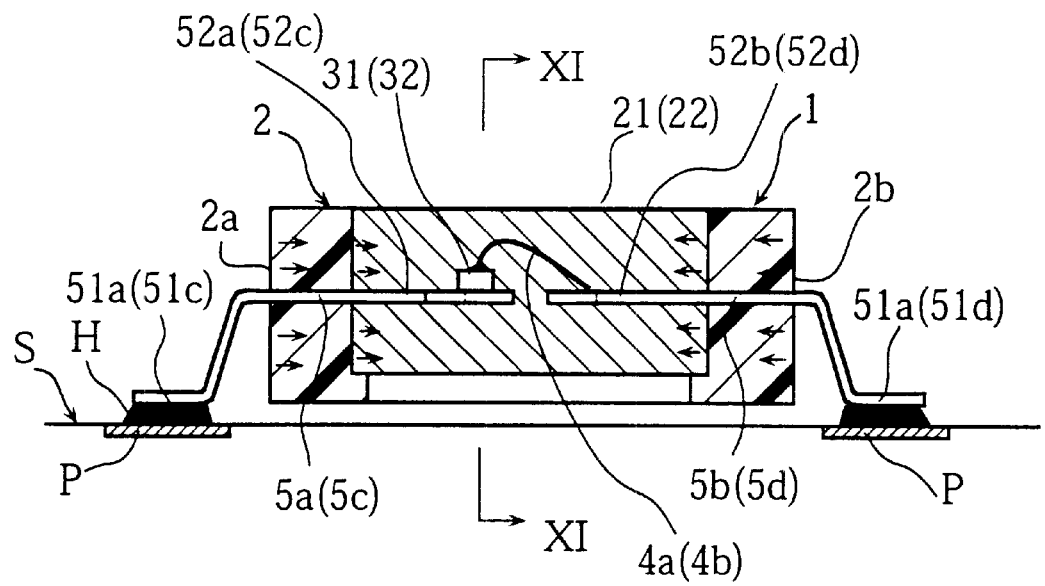
FIG. 10 is a sectional view taken in lines X—X in FIG. 9.
Figure 11:
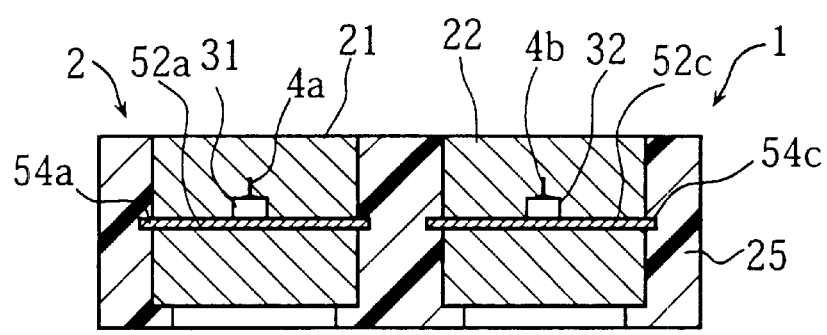
FIG. 11 is a sectional view taken in lines XI—XI in FIG. 10.

Next, a reflection sensor 1A according to a second embodiment of the present invention will be described with reference to FIGS. 9 to 11. FIG. 9 is a plan view showing an outline of the reflection sensor 1A. FIG. 10 is a sectional view taken in lines X—X in FIG. 9, whereas FIG. 11 is a sectional view taken in lines XI—XI in FIG. 10. As will be understood from these figures, the reflection sensor 1A has essentially the same constitution as the reflection sensor 1 according to the first embodiment.

Specifically, the reflection sensor 1A comprises a light emitting element 31 and a light receiving element 32. These elements are covered by a protective resin package 2. As shown in FIG. 9, the light emitting element 31 is electrically connected to a pair of metal leads 5a, 5b. Likewise, the light receiving element 32 is electrically connected to a pair of metal leads 5c, 5d. The leads 5a, 5c extend out of a first side surface 2a of the protective package 2 whereas the leads 5b, 5d extend out of a second side surface 2b away from the first side surface 2a. Hereinafter, extending portions of respective leads 5a~5d are called the outer portions.

As shown in FIGS. 10, the outer portions of the leads 5a~5d are bent in a shape of L to form horizontally extending free end portions 51a~51d respectively. These free end portions 51a~51d are generally flush with a bottom surface of the protective package 2.

The protective package 2 includes a first resin body 21 enclosing the light emitting element 31, a second resin body 22 enclosing the light receiving element 32, and a third resin body 25 holding the first and the second resin bodies. The first resin body 21 is spaced from the second resin body 22 by a predetermined distance. The first and the second resin bodies have respective upper surfaces not covered by the third resin body 25. Further, the first and the second resin bodies 21, 22 have respective lower surfaces covered only partially by the third resin body 25. Specifically, only peripheral portions of respective lower surfaces of the first and the second resin bodies are covered by the third resin body 25.

As shown in FIG. 9, the light emitting element 31 is bonded to an inner portion 52a of the lead 5a. The light emitting element 31 has an upper surface electrically connected to an inner portion 52b of the lead 5b via a wire 4a. Likewise, the light receiving element 32 is bonded to an inner portion 52c of the lead 5c. The light receiving element 32 has an upper surface electrically connected to an inner portion 52d of the lead 5d via a wire 4b.

The reflection sensor 1A according to the second embodiment differs from the reflection sensor 1 according to the first embodiment in the following points. Specifically, as shown in FIGS. 9 and 11, the inner portion 52a of the lead 5a is provided with a pair of projections (a first projecting portion 54a) facing away from each other. The first projecting portion 54a extends perpendicularly to a longitudinal axis of the lead 5a into the third resin body 25. By making such an engagement as the above with the third resin body, the first projecting portion 54a prevents the lead Sa from displacement with respect to the third resin body 25. Specifically, the first projecting portion 54a functions as fastening means of the lead 5a.

Likewise, the inner portion 52b of the lead 5b is formed with a pair of second projecting portions 54b. Further, the inner portion 52c of the lead 5c is provided with a pair of third projecting portion 54c, and the inner portion 52d of the lead 5d is provided with a pair of fourth projecting portion 54d. Each of the second projecting portion 54b, the third projecting portion 54c, and the fourth projecting portion 54d extends into the third resin body 25.

Figure 12:
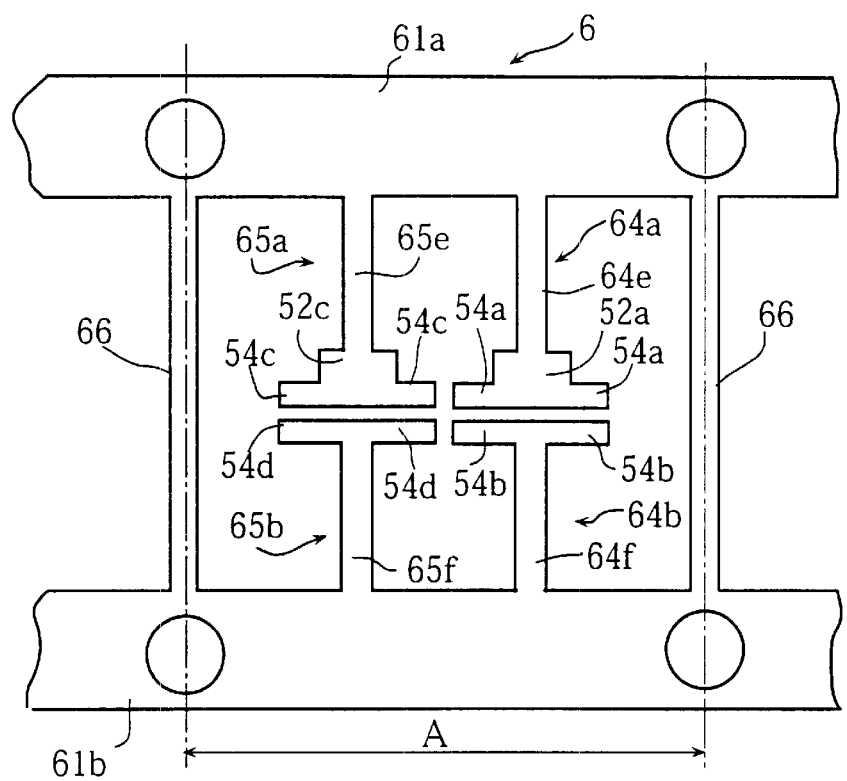
FIG. 12 is a plan view showing a lead frame used for manufacture of the reflection sensor in FIG. 9.

The reflection sensor 1A having the arrangement described as above can be manufactured in the following steps to be described below. First, a lead frame 6 as shown in FIG. 12 is prepared. The lead frame 6 can be produced by pressing a thin metal plate. As shown in the figure, the lead frame 6 includes a first long side band 61a and a second long side band 61b extending in parallel to each other. The first and the second side bands 61a, 61b are connected with each other via a plurality of cross members 66. The cross members 66 are spaced from each other by a predetermined distance A longitudinally of the lead frame 6.

In a region between a pair of mutually adjacent cross members 66, the first side band 61a is formed with two first leads 64a, 65a. The first leads 64a, 65a extend toward the second side band 61b. On the other hand, the second side band 61b is formed with two second leads 64b, 65b. The second leads 64b, 65b extend toward the first side band 61a. Respective free end portions of the first leads 64a, 65a are spaced from corresponding free end portions of the second leads 64b, 65b by a predetermined distance.

As shown in FIG. 12, the first leads 64a, 65a respectively have long base portions 64e, 65e directly connected to the first side frame 61a. Further, the base portions 54e, 65e are respectively connected to wider head portions 52a, 52c. The head portion 52a is formed with a pair of projecting portions 54a away from each other. Likewise, the head portion 52c is formed with a pair of projecting portions 54a away from each other. The projecting portions 54a extend perpendicularly to a longitudinal axis of the base portion 64e. The projecting portions 54c extend perpendicularly to a longitudinal axis of the base portion 65e.

The second leads 64b, 65b respectively have long base portions 64f, 65f directly connected to the second side frame 61b. The base portions 64f is formed with a pair of projecting portions 54b away from each other. The base portions 65f is formed with a pair of projecting portions 54d away from each other. The projecting portions 54b extend perpendicularly to a longitudinal axis of the base portion 64f. The projecting portions 54d extend perpendicularly to a longitudinal axis of the base portion 65f.

Figure 13:
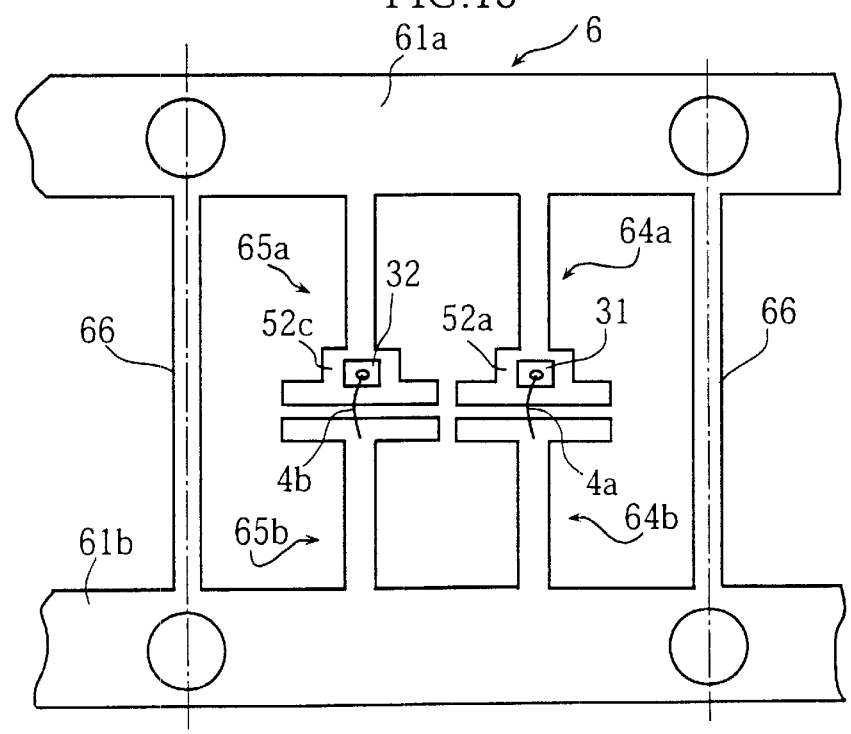
FIG. 13 shows a state in which a light emitting element and light receiving element are mounted on the lead frame in FIG. 12.

Next, as shown in FIG. 13, light emitting element 31 is bonded to the head portion 52a of the first lead 64a, and the light receiving element 32 is bonded to the head portion 52c of the first lead 65a. Thereafter, the upper surface of the light emitting element 31 and the second lead 64b are electrically connected together via the wire 4a. Likewise, the upper surface of the light receiving element 32 and the other second lead 65b are electrically connected together via the other wire 4b.

Figure 14:
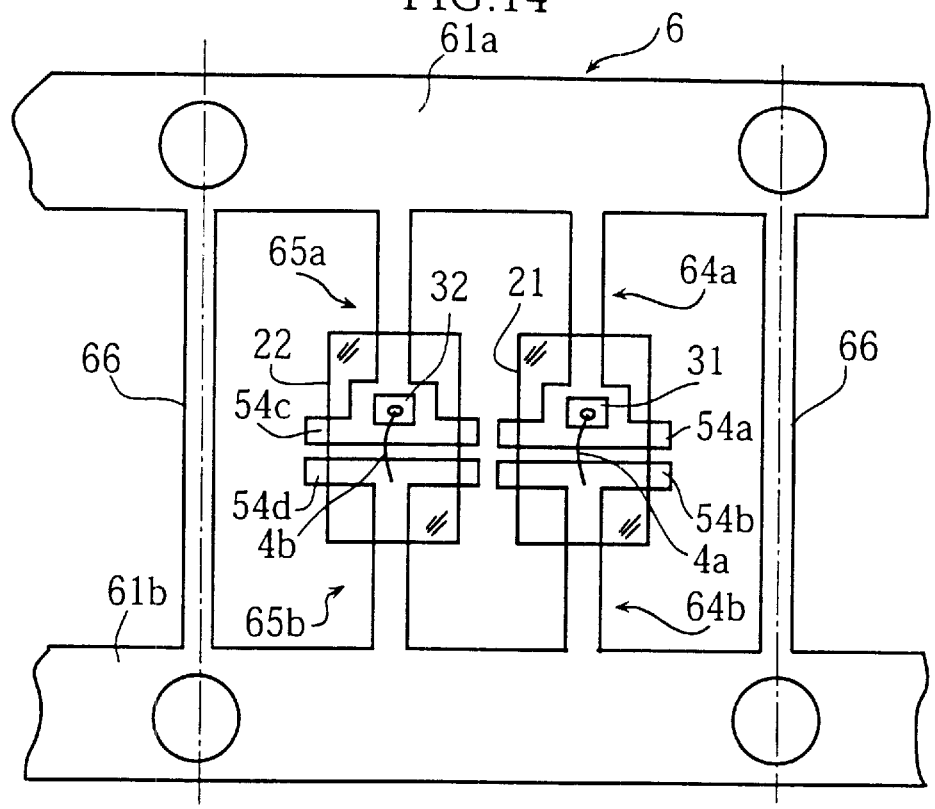
FIG. 14 shows a state in which each of the light emitting element and the light receiving element is covered by a transparent resin body.

Next, as shown in FIG. 14, the light emitting element 31 and the wire 4a are enclosed in the transparent resin body 21, and the light receiving element 32 and the wire 4b are enclosed in another transparent resin body 22. In this step, the resin body 21 is formed to allow the projecting portions 54a and the projecting portions 54b to extend out of the resin body 21. Further, the resin body 22 is formed to allow the projecting portions 54c and the projecting portions 54d to extend out of the resin body 22. Formation of the resin bodies 21, 22 can be achieved by means of a transfer molding method for example (the first molding step).

Figure 15:
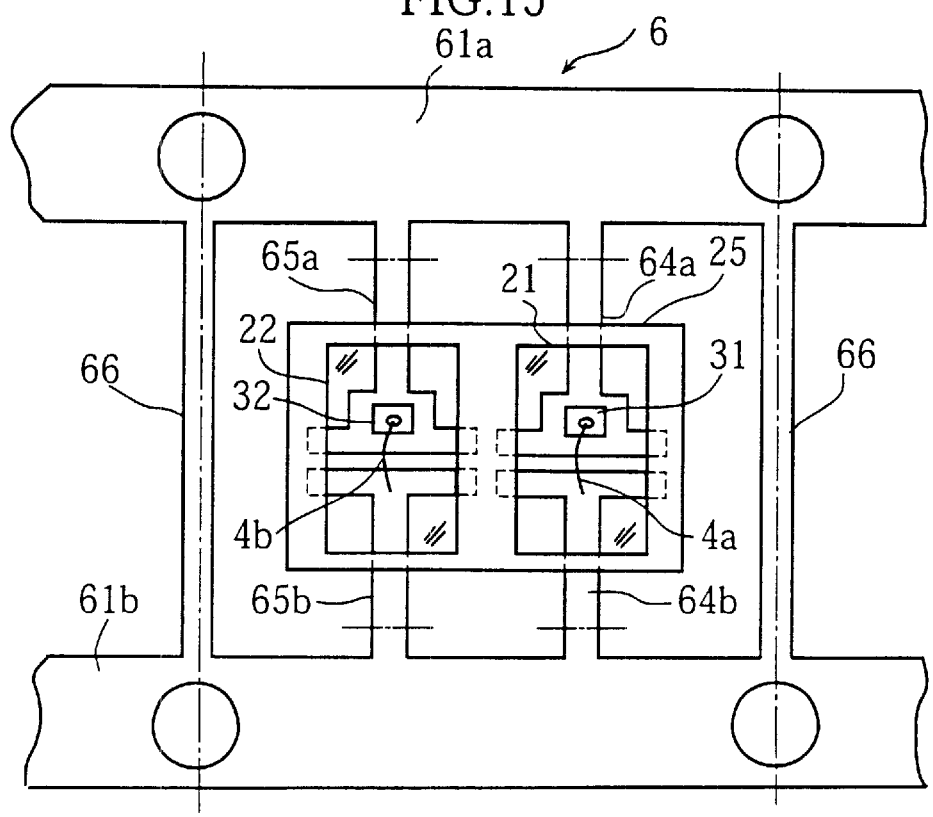
FIG. 15 shows a state in which the resin bodies in FIG. 14 is enclosed by another resin body which is non-transparent.

Next, as shown in FIG. 15, in order to hold both of the first and the second resin bodies 21, 22, the third resin body 25 made of a black non-transparent PPS is formed. Formation of this resin body can also be achieved by means of the transfer molding method (the second molding step). The third resin body 25 is formed so that the upper surfaces and the bottom surfaces of the first and the second resin bodies 21, 22 are exposed to outside.

Next, the first leads 64a, 65a are cut off the first side band 61a, and the second leads 64b, 65b are cut off the second side band 61b (lead cutting step) Finally, each of the leads are bent into a shape of L (lead forming step), providing an individual reflection sensor 1A.

The reflection sensor 1A has the following advantages.

First, respective upper surfaces and the bottom surfaces of the first and the second resin bodies 21, 22 are exposed to outside as in the first embodiment. Therefore, the same advantages as described for the reflection sensor 1 according to the first embodiment can be obtained in the reflection sensor 1A.

Further, according to the reflection sensor 1A, each of the projecting portions 54a~54d of the leads 5a~5d extends into the third resin body 25. The third resin body 25 is formed of a mechanically strong material (such as PPS). Therefore, the leads 5a~5d is not displaced with respect to the third resin body 25. Thus, even if the first and the second resin bodies 21, 22 thermally expand, excessive stress is not exerted to the wires 4a, 4b. Further, even if the leads 5a~5d come under a pulling force when the reflection sensor 1A is cooled after being heated in the heating furnace, the pulling force is not transferred to the wires 4a, 4b.

As understood from the description thus far above, the reflection sensor 1A does not develop problems neither in the heating step nor in the cooling step. Further, if the projecting portions 54~54d are provided, the bottom surfaces of the first and the second resin bodies 21, 22 may be covered by the third resin body 25.

Figure 16:
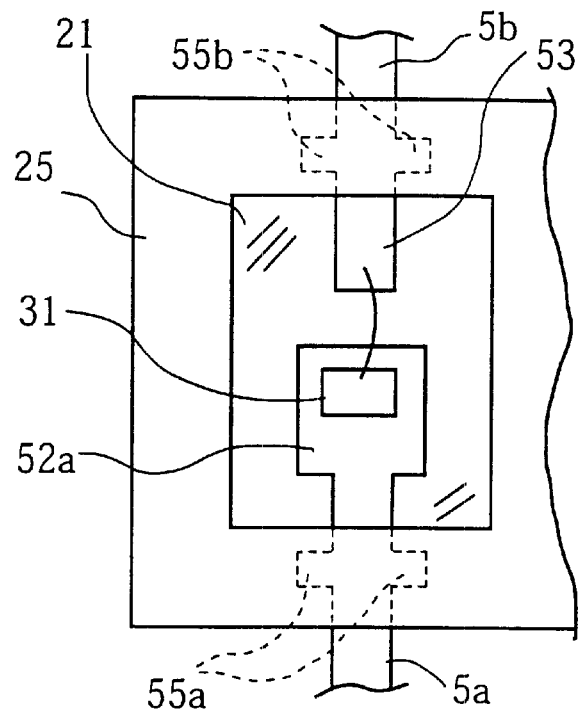
FIG. 16 is a plan view showing a primary portion of a reflection sensor according to a third embodiment of the present invention.

FIG. 16 shows a primary portion of a reflection sensor according to a third embodiment of the present invention. According to the third embodiment, a pair of projecting portions 55a are provided at locations where the lead 5a cross the third resin body 25. Further, another pair of projecting portions 55b are provided at locations where the lead 5b cross the third resin body 25. Though not shown in the figure, the leads 5c and 5d are also provided with the projecting portions. With the above described arrangement, it also becomes possible to prevent unwanted displacement of the leads 5a, 5b with respect to the third resin body 25.

Figure 17:
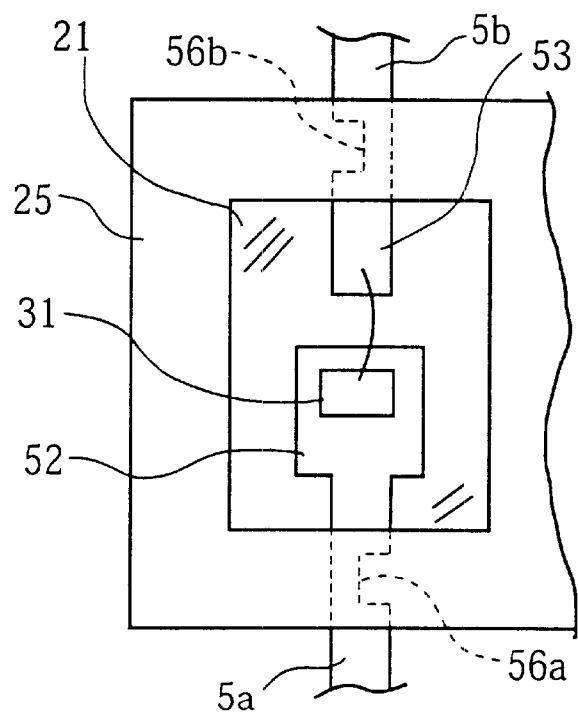
FIG. 17 is a plan view showing a primary portion of a reflection sensor according to a fourth embodiment of the present invention.
Figure 18:
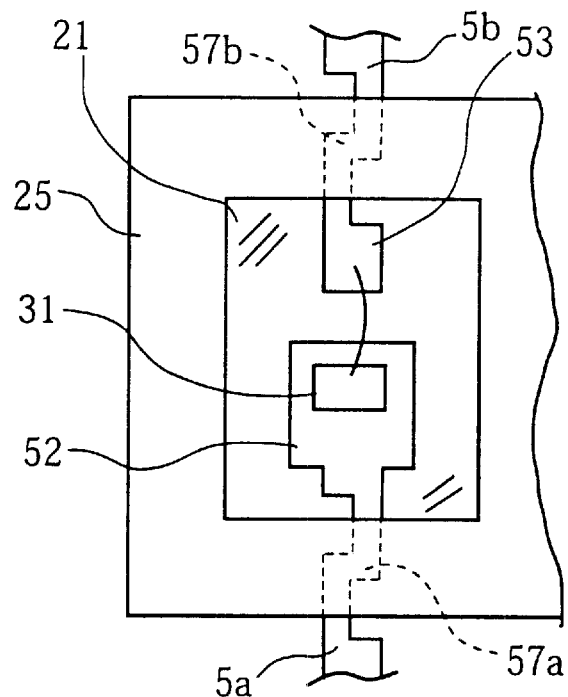
FIG. 18 is a plan view showing a primary portion of a reflection sensor according to a fifth embodiment of the present invention.
Figure 19:
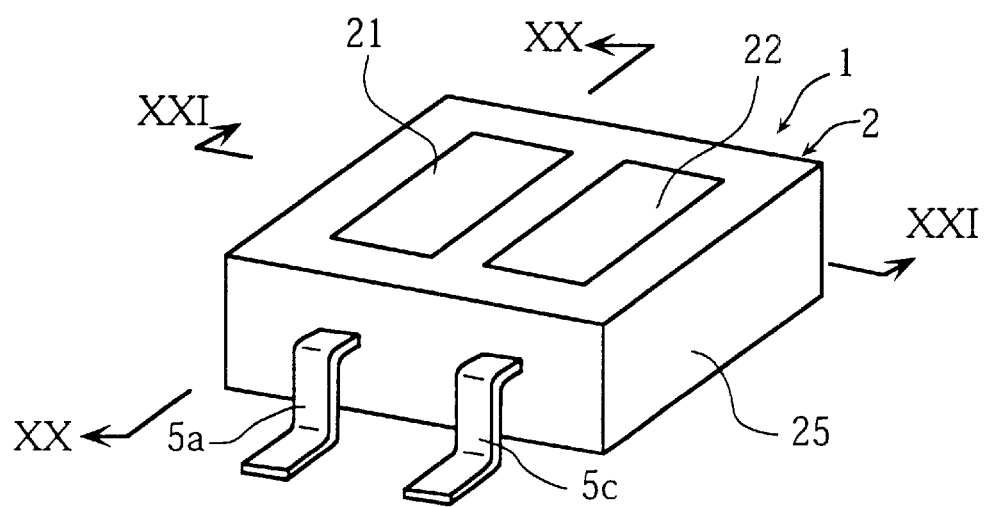
FIG. 19 is a perspective view showing a conventional reflection sensor.

FIG. 17 shows a primary portion of a reflection sensor according to a fourth embodiment of the present invention. According to this embodiment, cutouts 56a, 56b are provided in the leads 5a, 5b respectively. Though not shown in the figure, the leads 5c and 5d are also provided with the cutouts. FIG. 18 shows a primary portion of a reflection sensor according to a fifth embodiment of the present invention. According to this embodiment, bent portions 57a, 57b are provided in the leads 5a, 5b respectively. Though not shown in the figure, the leads 5c and 5d are also provided with the bent portions. With each of the arrangements shown in FIG. 17 and FIG. 18, it also becomes possible to prevent unwanted displacement of the leads 5a, 5b with respect to the third resin body 25.

What is claimed is:

1. A reflection sensor comprising:
    a light emitting element (31);
    a light receiving element (32) cooperative with the light emitting element;
    a first resin body (21) enclosing the light emitting element and including a first surface and a second surface away from the first surface;
    a second resin body (22) enclosing the light receiving element and including a third surface and a fourth surface away from the third surface;
    a third resin body (25) holding the first and the second resin bodies;
    a first pair of leads (5a, 5b) electrically connected to the light emitting element;
    a second pair of leads (5c, 5d) electrically connected to the light receiving element;
    wherein the third resin body is formed with a plurality of openings respectively wider than the first and the second leads (5a, 5b, 5c, 5d),
    wherein the first surface and the second surface of the first resin body and the third surface and the fourth surface of the second resin body are exposed to outside of the third resin body respectively in the openings; and
    wherein the first and the second resin bodies (21, 22) have a thermal expansion coefficient larger than that of the third resin body (25).

2. The reflection sensor according to claim 1, wherein the first and the second resin bodies (21, 22) are transparent, the third resin body (25) being non-transparent.

3. The reflection sensor according to claim 1, wherein the first and the second resin bodies (21, 22) are formed of an epoxy resin, the third resin body (25) being formed of a heat resistant resin.

4. The reflection sensor according to claim 1, wherein the second surface of the first resin body (21) provides a bottom surface of the first resin body, the fourth surface of the second resin body (22) providing a bottom surface of the second resin body.

5. The reflection sensor according to claim 4, wherein the bottom surface of the first resin body (21) and the bottom surface of the second resin body (22) are covered only partially by the third resin body (25).

6. The reflection sensor according to claim 1, wherein the leads (5a, 5b, 5c, 5d) of the first pair and the second pair have respective free end portions (51a, 51b, 51c, 51d) flush with the bottom surface of the second resin body (22).

7. A reflection sensor comprising:

a light emitting element (31);

a light receiving element (32) cooperative with the light emitting element;

a first resin body (21) enclosing the light emitting element and including an upper surface and a bottom surface away from the upper surface;

a second resin body (22) enclosing the light receiving element and including an upper surface and a bottom surface away from the upper surface;

a third resin body (25) holding the first and the second resin bodies;

a first pair of leads (5a, 5b) electrically connected to the light emitting element;

a second pair of leads (5c, 5d) electrically connected to the light receiving element;

wherein the leads (5a, 5b, 5c, 5d) of the first pair and the second pair are respectively provided with engaging means for engagement with the third resin body to prevent the leads from displacement with respect to the third resin body;

wherein the upper surface and the bottom surface of the first resin body and the upper surface and the bottom surface of the second resin body are exposed to outside of the third resin body respectively in the openings; and wherein the first and the second resin bodies (21, 22) have a thermal expansion coefficient larger than that of the third resin body (25).

8. The reflection sensor according to claim 7, wherein the leads (5a, 5b) of the first pair are respectively formed with projecting portions (54a, 54b) extending from the first resin body (21) into the third resin body (25), the leads (5c, 5d) of the second pair being respectively formed with projecting portions (54c, 54d) extending from the second resin body (22) into the third resin body (25).

9. The reflection sensor according to claim 7, wherein the leads (5a, 5b, 5c, 5d) of the first pair and the second pair are respectively formed with projecting portions (55a, 55b) at locations where the leads cross the third resin body (25).

10. The reflection sensor according to claim 7, wherein the leads (5a, 5b, 5c, 5d) of the first pair and the second pair are respectively formed with cutouts (56a, 56b) at locations where the leads cross the third resin body (25).

11. The reflection sensor according to claim 7, wherein the leads (5a, 5b, 5c, 5d) of the first pair and the second pair are respectively formed with bent portions (57a, 57b) at locations where the leads cross the third resin body (25).

* * * * *